US012666836B2

(12) United States Patent
Jeong

(10) Patent No.: US 12,666,836 B2
(45) Date of Patent: Jun. 23, 2026

(54) DISPLAY DEVICE AND MANUFACTURING METHOD THEREOF

(71) Applicant: Samsung Display Co., LTD., Yongin-si (KR)

(72) Inventor: Da-Hee Jeong, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 248 days.

(21) Appl. No.: 18/341,891

(22) Filed: Jun. 27, 2023

(65) Prior Publication Data

US 2024/0074271 A1 Feb. 29, 2024

(30) Foreign Application Priority Data

Aug. 24, 2022 (KR) ........................ 10-2022-0106199

(51) Int. Cl.
| | |
|---|---|
| *H10K 59/35* | (2023.01) |
| *G06V 40/13* | (2022.01) |
| *H10K 59/65* | (2023.01) |
| *H10K 71/16* | (2023.01) |

(52) U.S. Cl.
CPC ....... *H10K 59/352* (2023.02); *G06V 40/1318* (2022.01); *H10K 59/353* (2023.02); *H10K 59/65* (2023.02); *H10K 71/166* (2023.02)

(58) Field of Classification Search
CPC .... H10K 59/352; H10K 59/353; H10K 59/65; H10K 71/166; H10K 39/34; H10K 59/60; H10K 50/15; H10K 59/351; H10K 71/00; G06V 40/1318
See application file for complete search history.

(56) References Cited

U.S. PATENT DOCUMENTS

| | | | | |
|---|---|---|---|---|
| 2010/0118002 A1* | 5/2010 | Yamashita | ........... | G09G 3/3233 |
| | | | | 345/205 |
| 2010/0308427 A1* | 12/2010 | Lenchenkov | ......... | H10F 39/024 |
| | | | | 257/E31.127 |
| 2012/0295508 A1 | 11/2012 | Sung et al. | | |
| 2018/0261655 A1 | 9/2018 | Lee et al. | | |
| 2020/0111851 A1* | 4/2020 | Park | ..................... | H10K 59/805 |
| 2021/0126035 A1* | 4/2021 | Roh | ....................... | G02B 1/002 |

(Continued)

FOREIGN PATENT DOCUMENTS

| | | |
|---|---|---|
| KR | 10-2010-0001598 A | 1/2010 |
| KR | 10-1865215 | 6/2018 |

(Continued)

*Primary Examiner* — S M Sohel Imtiaz
(74) *Attorney, Agent, or Firm* — Womble Bond Dickinson (US) LLP

(57) ABSTRACT

A display device according to an embodiment includes blue pixels, red pixels, green pixels, and optical sensing pixels disposed on a substrate, wherein a first group of the optical sensing pixels are disposed in a same line in a second direction, a second group comprising a group of the red pixels, a group of the optical sensing pixels, and a group of the blue pixels are disposed in a same line in a first direction that is perpendicular to the second direction, and a distance between a first of the blue pixels and a first of the red pixels disposed with a first of the optical sensing pixels therebetween is longer than a distance between the first of the blue pixels and a second of the red pixels without the optical sensing pixel therebetween.

15 Claims, 16 Drawing Sheets

(56)                    References Cited

U.S. PATENT DOCUMENTS

| | | | |
|---|---|---|---|
| 2021/0200366 A1 | 7/2021 | Bok et al. | |
| 2021/0257420 A1* | 8/2021 | Park | G06F 3/0412 |
| 2021/0408140 A1 | 12/2021 | Han et al. | |
| 2022/0005877 A1 | 1/2022 | Seo et al. | |
| 2022/0059586 A1* | 2/2022 | Tsai | H10F 39/803 |
| 2022/0122371 A1* | 4/2022 | Zhang | G02F 1/134345 |
| 2022/0123071 A1* | 4/2022 | Cho | G06F 3/14 |
| 2022/0165814 A1* | 5/2022 | Rieutort-Louis | H10K 59/88 |
| 2022/0351540 A1* | 11/2022 | Hai | H10K 59/124 |
| 2023/0217765 A1* | 7/2023 | Chung | H10K 59/352 |
| | | | 257/40 |
| 2023/0232690 A1 | 7/2023 | Jung et al. | |

FOREIGN PATENT DOCUMENTS

| | | |
|---|---|---|
| KR | 10-2018-0103206 A | 9/2018 |
| KR | 10-2021-0064483 | 6/2021 |
| KR | 10-2021-0086907 A | 7/2021 |
| KR | 10-2021-0158592 A | 12/2021 |
| KR | 10-2022-0004871 A | 1/2022 |
| KR | 10-2022-0032283 | 3/2022 |
| KR | 10-2023-0111707 | 7/2023 |

* cited by examiner

Green full row lighting

Rx1          Rx2          Rx3

Green even row 1/2 lighting

Rx1          Rx2          Rx3

45.2

DISPLAY DEVICE AND MANUFACTURING METHOD THEREOF

CROSS-REFERENCE TO RELATED APPLICATION

This application claims priority to and the benefit of Korean Patent Application No. 10-2022-0106199 under 35 U.S.C. § 119, filed in the Korean Intellectual Property Office on Aug. 24, 2022, the entire contents of which are incorporated herein by reference.

BACKGROUND

1. Technical Field

The disclosure relates to a display device for sensing biometric fingerprint inputs and a manufacturing method thereof.

2. Description of the Related Art

Multimedia display devices such as televisions, portable phones, tablet computers, GPS, or game devices include display devices for displaying images. The display devices may have an input sense panel for providing a touch-based input method for a user to intuitively and easily input information or instructions in addition to conventional inputting means such as buttons, keyboards, or mouses.

Recently, methods for using fingerprints belonging to biometric information as user certification means for online banking, purchases of merchandise, or security are proposed, and demands on touch display devices with the fingerprint recognition function are increasing.

As the fingerprint recognition function is added, integration of pixels on the display panel increases.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Embodiments provide a display device for displaying image information and sensing user biometric fingerprint information, and a manufacturing method thereof.

An embodiment of the invention provides a display device including: blue pixels, red pixels, green pixels, and optical sensing pixels disposed on a substrate, wherein a first group of the optical sensing pixels are disposed in a same line in a second direction, a second group comprising a group of the red pixels, a group of the optical sensing pixels, and a group of the blue pixels are disposed in a same line in a first direction that is perpendicular to the second direction, and a distance between a first of the blue pixels and a first of the red pixels disposed with a first of the optical sensing pixels therebetween is longer than a distance between the first of the blue pixels and a second of the red pixels without the optical sensing pixel therebetween.

The first of the red pixels, the first of the optical sensing pixels, the first of the blue pixels, the second of the red pixels, a second of the optical sensing pixels, and a second of the blue pixels are disposed in a sequential order in the first direction.

A group of the green pixels may be disposed in a same line in the first direction.

The group of the green pixels may not be disposed in a same line in the first direction in which the second group is disposed.

Emission layers of green pixels neighboring in the first direction may be electrically connected to each other.

An embodiment of the invention provides a display device including: pixel sections disposed on the substrate, wherein: at least one of the pixel sections includes four green pixels, two red pixels, two blue pixels, and two optical sensing pixels, a group of the optical sensing pixels are disposed in a same line in a first direction in which a corresponding group of the red pixels and a corresponding group of the blue pixels are disposed, each optical sensing pixel is not disposed, in a same line in a second direction that is perpendicular to the first direction, with any of the red pixels, any of the green pixels, or any of the blue pixels, and a distance of two of the green pixels disposed in one of the pixel sections in the first direction is greater than a distance of two neighboring green pixels disposed in respective neighboring pixel sections in the first direction.

None of the green pixels may be disposed, in a same line in the first direction, in which any of the red pixels, any of the blue pixels, and any of the optical sensing pixels are disposed.

In the one of the pixel sections, two corresponding ones of the green pixels may be disposed in a same line in the second direction in which a corresponding one of the red pixels and a corresponding one of the blue pixels are disposed.

Emission layers of two green pixels disposed in other units and neighboring in the first direction may be electrically connected to each other.

The blue pixels, the green pixels, the red pixels, and the optical sensing pixels each may have a corresponding opening of a quadrangular shape.

At least one of the blue pixels, the green pixels, and the red pixels may have an opening of an octagonal shape.

An embodiment of the invention provides a method for manufacturing a display device, the method including: providing a substrate including green pixels, blue pixels, red pixels, and optical sensing pixels; and forming an emission layer of the green pixel, wherein a first group of the optical sensing pixels are disposed in a same line in a second direction, a second group comprising a group of the red pixels, a group of the optical sensing pixels, and a group of the blue pixels are disposed in a same line in a first direction that is perpendicular to the second direction, a distance between a first of the blue pixels and a first of the red pixels disposed with a first of the optical sensing pixels therebetween is longer than a distance between the first of the blue pixels and a second of the red pixels not disposed with the optical sensing pixel therebetween, the green pixels are disposed in parallel to each other in the first direction, and the forming of an emission layer of the green pixel includes forming emission layers of neighboring groups of the green pixels in the first direction by using one mask opening.

The emission layers of the neighboring groups of green pixels in the first direction may be electrically connected to each other.

The method may further include forming a hole transport layer of one of the optical sensing pixels and a hole control layer of one of the red pixels, wherein the hole transport layer of the one optical sensing pixel and the hole control layer of the one of the red pixels are formed by using one mask.

The first group of the optical sensing pixels may not be disposed in a same line in the second direction in which any red pixel, any green pixel, and any blue pixel are disposed.

The green pixels may not be disposed in a same line in the first direction in which the second group is disposed.

According to the embodiments, the display device for displaying image information and sensing user biometric fingerprint information, and the manufacturing method thereof are provided.

However, embodiments of the disclosure are not limited to those set forth herein. The above and other embodiments will become more apparent to one of ordinary skill in the art to which the disclosure pertains by referencing the detailed description of the disclosure given below.

BRIEF DESCRIPTION OF THE DRAWINGS

The above and other aspects and features of the disclosure will become more apparent by describing in detail embodiments thereof with reference to the attached drawings, in which.

DETAILED DESCRIPTION OF THE EMBODIMENTS

Figure 1:
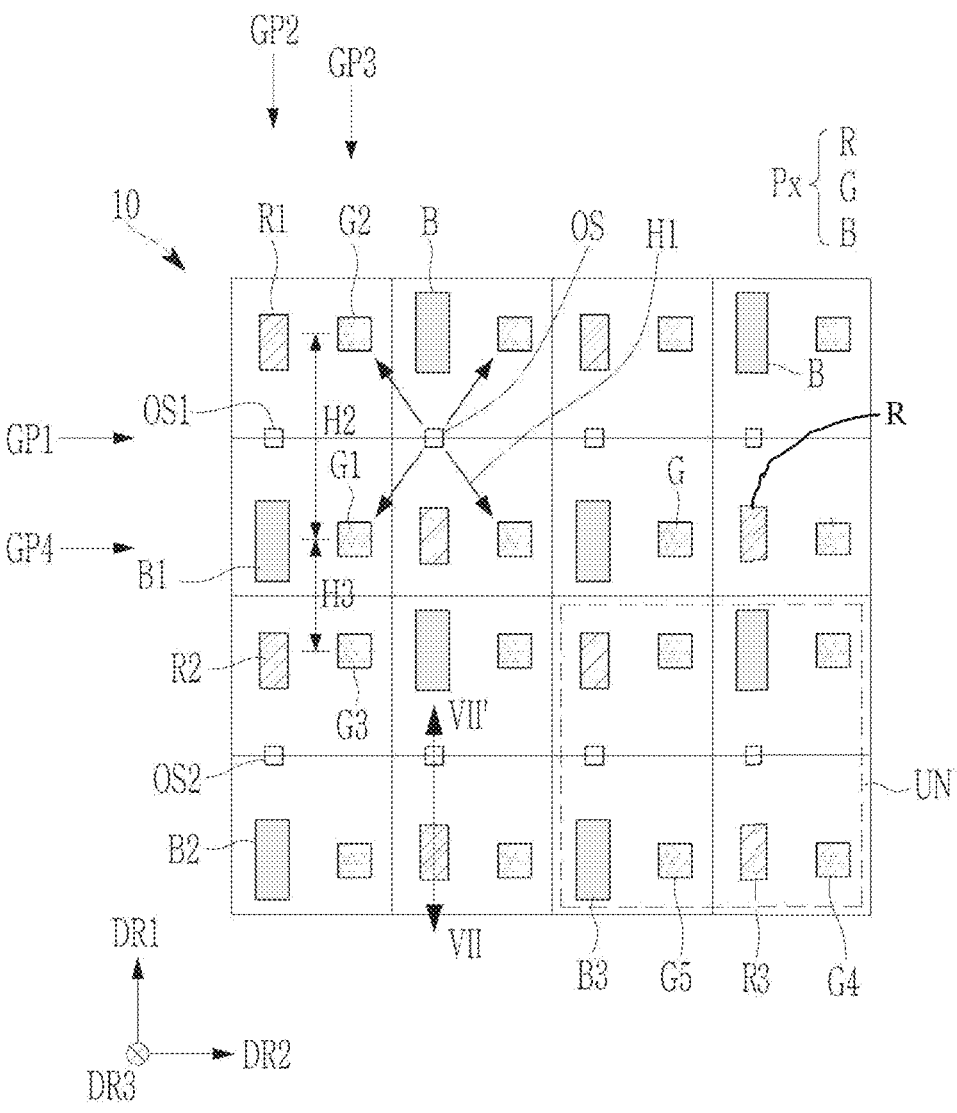
FIG. 1 shows a pixel array comprising light emitting pixels and optical sensing pixels of a display device in a plan view according to an embodiment.

The disclosure will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

Parts that are irrelevant to the description will be omitted to clearly describe the embodiments, and the same elements will be designated by the same reference numerals throughout the specification.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals and/or reference characters denote like elements.

As used herein, the singular forms, "a," "an," and "the" are intended to include the plural forms as well, unless the context clearly indicates otherwise.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean "A, B, or A and B."

It will be understood that, although the terms first, second, etc., may be used herein to describe various elements, these elements should not be limited by these terms. These terms are only used to distinguish one element from another element. For example, a first element may be referred to as a second element, and similarly, a second element may be referred to as a first element without departing from the scope of the disclosure.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

It will be understood that the terms "connected to" or "coupled to" may include a physical or electrical connection or coupling.

It will be understood that when an element (or a region, a layer, a portion, or the like) is referred to as "being on", "connected to" or "coupled to" another element in the specification, it can be directly disposed on, connected or coupled to another element mentioned above, or intervening elements may be disposed therebetween.

Unless explicitly described to the contrary, the word "comprise", and variations such as "comprises" or "comprising", will be understood to imply the inclusion of stated elements but not the exclusion of any other elements.

The phrase "on a plane" means viewing the object portion from the top, and the phrase "on a cross-section" means viewing a cross-section of which the object portion is vertically cut from the side.

A display device and a manufacturing method thereof according to an embodiment of the invention will now be described in detail with reference to accompanying drawings.

FIG. 1 shows a pixel array 10 comprising light emitting pixels PX and optical sensing pixels OS of a display device in a plan view according to an embodiment. Referring to FIG. 1, the respective light emitting pixels PX may include light-emitting devices and may emit light. In detail, the light emitting pixels PX may include a red pixel R (e.g., R1, R2, R3), a green pixel G (e.g., G1, G2, G3, G4, G5), and a blue pixel B (e.g., B1, B2, B3). The red pixel R emits red light, the green pixel G emits green light, and the blue pixel B emits blue light. The optical sensing pixel OS (e.g., OS1, OS2) may include an optical sensing device, and may sense external light. The optical sensing pixel OS may sense external light and may recognize a fingerprint. For example, the optical sensing pixel OS may sense the light reflected by ridges or valleys between the ridges of the fingerprint and may recognize the fingerprint.

The light emitting pixels PX and the optical sensing pixels OS are shown with respect to the openings of the respective pixels in FIG. 1. The openings of the respective pixels may have quadrangular shapes as shown in FIG. 1. This is however an example embodiment, and the openings of the respective pixels may have an octagonal shape or other shapes, depending on embodiments.

As shown in FIG. 1, the display device according to the embodiment may include light emitting pixels PX for emitting colored light and optical sensing pixels OS for sensing light, and may sense external light and may sense the fingerprint. As the optical sensing pixels OS are positioned as described above, a processing margin may be insufficient in case that the same resolution is given, compared to the display device including no optical sensing pixels OS. For example, compared to the case in which the display device includes no optical sensing pixel OS, in case that the display device includes the optical sensing pixel OS, the number of the pixels to be disposed per same area increases so the resolution may be deteriorated or design of efficient implementation may not be readily performed, and an aperture ratio may be lowered.

Sensing performance of the optical sensing pixel OS increases in case that a distance between the green pixel G and the optical sensing pixel OS increases, hence the increased distance between the green pixel G and the optical sensing pixel OS may improve sensing performance of the optical sensing pixel OS and may prevent the resolution from bring deteriorated or the aperture ratio from being reduced.

Referring to FIG. 1, regarding the display device according to the embodiment, a group GP2 comprising a group of the red pixels R1 and R2, a group of the optical sensing pixels OS1 and OS2, and a group of the blue pixels B1 and B2 are positioned in a same line in a first direction DR1. The group GP2 can comprise, in a sequential order in the first direction DR1, the red pixel R1, the optical sensing pixel OS1, the blue pixel B1, the red pixel R2, the optical sensing pixel OS2, and the blue pixel B2.

The group GP4 can comprise, in a second direction DR2, a group of red pixels R, a group of green pixels G, and a group of blue pixels B that are positioned in a same line. The optical sensing pixel OS and other light emitting pixels are not positioned in the same line in the second direction DR2 corresponding to the group GP4. A group GP3 of green pixels G are disposed in a same line in the first direction DR1; as illustrated in FIG. 1, other light emitting pixels including red pixels R and blue pixels B and the optical sensing pixels OS are not positioned in the second same line in the first direction DR1 corresponding to the group GP3 of green pixels G. Hence, none of the green pixels G are disposed, in the same direction in the first direction DR1, with any of the red pixels R, any of the blue pixels B, and/or any of the optical sensing pixels OS1 (e.g., of the group GP2) in the first direction DR1.

Referring to FIG. 1, a group GP1 of the optical sensing pixels OS are disposed in a same line in the second direction DR2, and no other light emitting pixels are positioned in the second direction DR2 with respect to the optical sensing pixel OS1, the red pixel R1 and the blue pixel B1 that are positioned in the first direction DR1 within the group GP2. Hence, the group GP1 of optical sensing pixels OS are not disposed in the line in which any red pixel R, any green pixel G, and/or any blue pixel B of the group GP2 are disposed Four green pixels G are positioned in a diagonal direction of one optical sensing pixel OS.

FIG. 1 shows that the pixel array 10 comprises pixel sections UN, each of which represents a minimum unit for repeating a form of implementation in the pixel array 10. Referring to FIG. 1, one pixel section UN may include two red pixels R, two blue pixels B, two optical sensing pixels OS, and four green pixels G. As illustrated in FIG. 1, any green pixel G and any optical sensing pixel OS are not positioned in a same line in the first direction DR1 or the second direction DR2. In other words, an optical sensing pixel OS is not positioned along a line of the group GP3 comprising the green pixels G, and a green pixel G is not positioned along a line of the group GP1 comprising the optical sensing pixels OS. However, two of the corresponding green pixels (e.g., G4, G5) in a pixel section UN may be disposed in a same line in the second direction DR2 with a corresponding red pixel (e.g., R3) and a corresponding blue pixel (e.g., B3)

As illustrated in FIG. 1, the distances H2, H3 between one green pixel G and the green pixels G neighboring above and below the one green pixel G in the first direction DR1 are different.

For example, the green pixels G are not arranged at regular distance intervals in the first direction DR1, but are disposed to be alternately spaced at a first distance interval H2 and a second distance interval H3. In this instance, the first distance interval H2 between the green pixel G1 and the green pixel G2 in the same pixel section UN is longer than the second distance interval H3 between the green pixel G1 and the green pixel G3 in a neighboring pixel section UN. The second distance interval H3 may be longer than a minimum processing margin. The minimum processing margin is changeable according to the resolution, for example, it may be about 15 μm to about 20 μm.

In a like way, the red pixel R and the blue pixel B are not arranged at the same distance interval in the first direction DR1, but are disposed to be spaced from each other at the first distance interval H2 and the second distance interval H3. The first distance interval H2 between the red pixel R1 and the blue pixel B1 is longer than the second distance interval H3 between the red pixel R2 and the blue pixel B1. The second distance interval H3 may be longer than the minimum processing margin. The minimum processing margin is changeable according to the resolution, and for example, it may be 15 about μm to about 20 μm.

A group GP1 of the optical sensing pixels OS may be positioned between the red pixels R and the blue pixels B with the first distance interval H2 therebetween. The optical sensing pixel OS may not be positioned between the red pixel R and the blue pixel B with the second distance interval H3 therebetween. For example, the optical sensing pixel OS may be positioned in the region with the wide distance interval H2 between the light emitting pixels, and may not be positioned in the region with the narrow distance interval H3 between the light emitting pixels.

In case that the interval between the pixels is varied, and the optical sensing pixel OS is positioned in the region with the wide distance interval H2 between the pixels, the distance H1 between the optical sensing pixel OS and the green pixel G may be increased. Hence, to be additionally described hereinafter, the sensing performance of the optical sensing pixel OS may be improved.

Figure 2:
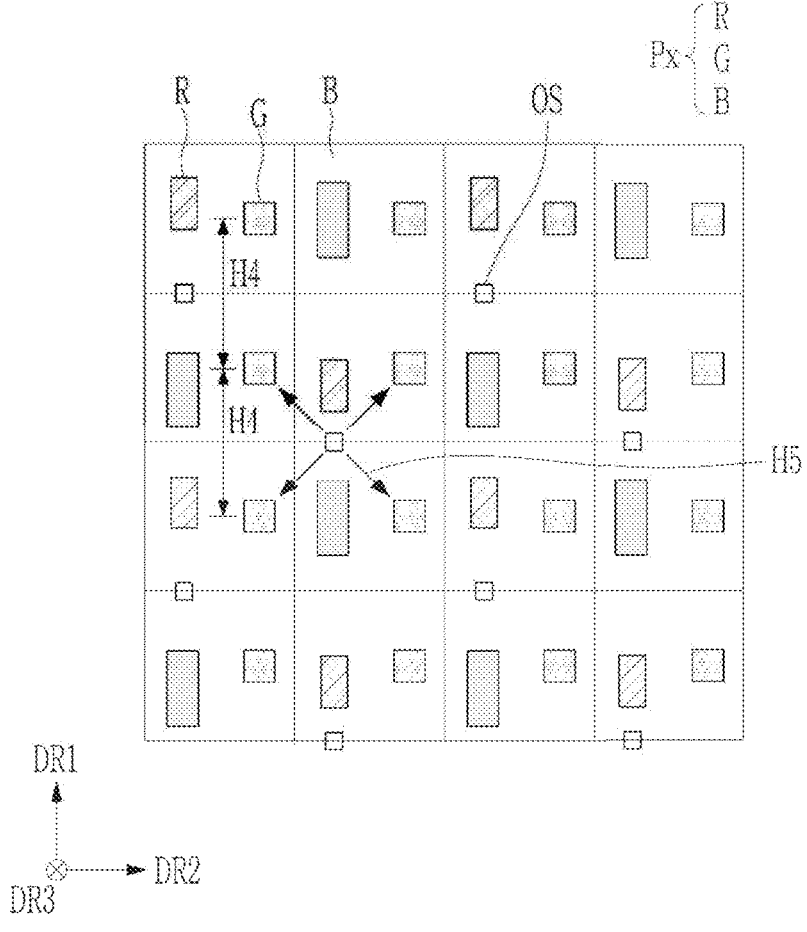
FIG. 2 shows an embodiment in which distance intervals in a first direction among respective light emitting pixels are equal to each other.

FIG. 2 shows an embodiment in which distance intervals H4 in the first direction DR1 among respective light emitting pixels are equal to each other. Referring to FIG. 1, according to an embodiment given with FIG. 2, the green pixel G is disposed to have a same distance interval H4 in the first direction DR1. In a like way, the red pixel R and the blue pixel B are disposed to have between each other the same distance interval H4 in the first direction DR1. The optical sensing pixel OS is positioned between the red pixel R and the blue pixel B, and a distance H5 from the optical sensing pixel OS to each of the neighboring green pixels G is shown.

In this instance, in case that the distance H1 between the optical sensing pixel OS and the green pixel G in FIG. 1 is compared to the distance H5 between the optical sensing pixel OS and the green pixel G according to an embodiment given with FIG. 2, it is found that the distance H1 of FIG. 1 is longer than the distance H5 of FIG. 2. For example, in case that the optical sensing pixel OS is positioned on the point where the spaced distance H2 between the green pixels G is longer, the distance H1 between the optical sensing pixel OS and the green pixel G increases. Hence, the sensing performance of the optical sensing device OSD may be improved.

For example, in case that the light emitting pixels are uniformly arranged on the panel with the aperture ratio of about 15.05% and the resolution of about 496 ppi as shown in FIG. 2, the distance H5 between the optical sensing pixel OS and the green pixel G may be about 23.6 μm, but in case that they are non-uniformly arranged as shown in FIG. 1, the distance H1 between the optical sensing pixel OS and the green pixel G may be increased to be about 28.2 μm.

In case that the light emitting pixels are uniformly arranged on the panel with the aperture ratio of about 14.93% and the resolution of about 374 ppi as shown in FIG. 2, the distance H5 between the optical sensing pixel OS and the green pixel G may be about 30.5 μm, but in case that they are non-uniformly arranged as shown in FIG. 1, the distance H1 between the optical sensing pixel OS and the green pixel G may be increased to be about 43.3 μm.

Figure 3:
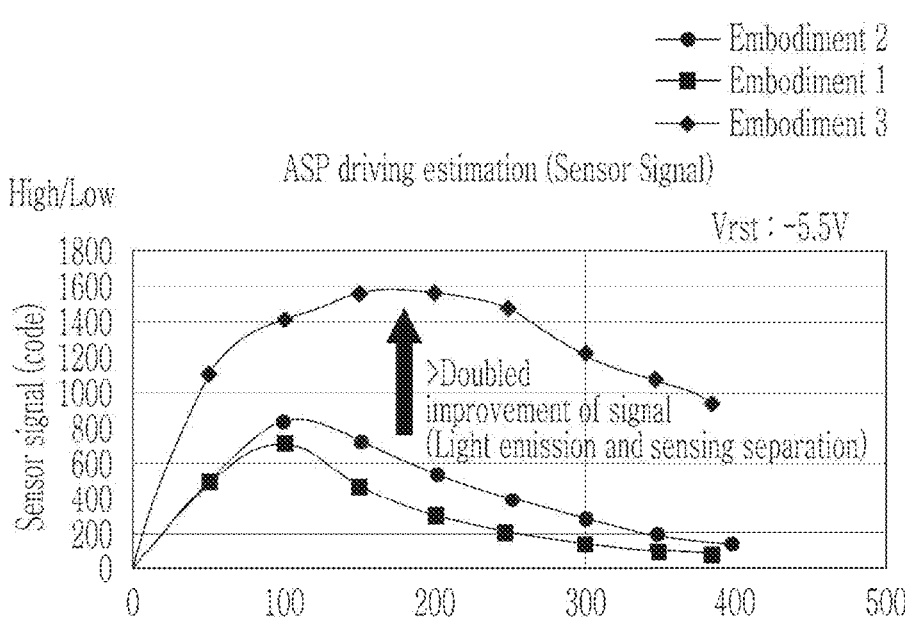
FIG. 3 shows a result of measuring sensing performance of a sensor by varying a distance between an optical sensing device and a green pixel.

FIG. 3 shows a result of measuring sensing performance of a sensor by varying a distance between an optical sensing device and a green pixel. Embodiment 1 of FIG. 3 describes measurement of sensing performance on the configuration of FIG. 4, Embodiment 2 describes measurement of sensing performance on the configuration of FIG. 5, and Embodiment 3 describes measurement of sensing performance on the configuration of FIG. 6.

Figure 4:
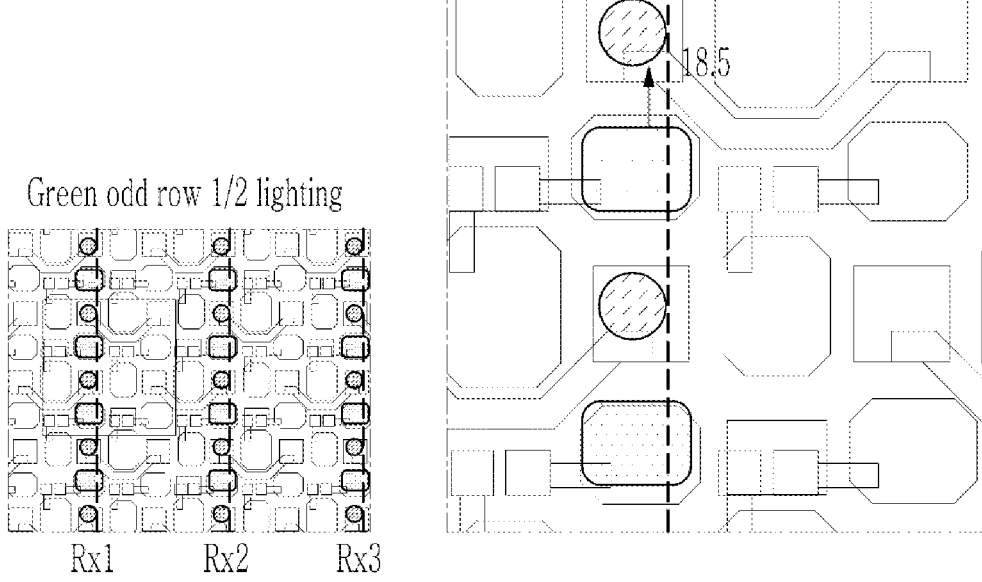
FIG. 4 corresponds to Embodiment 1 of FIG. 3.
Figure 5:
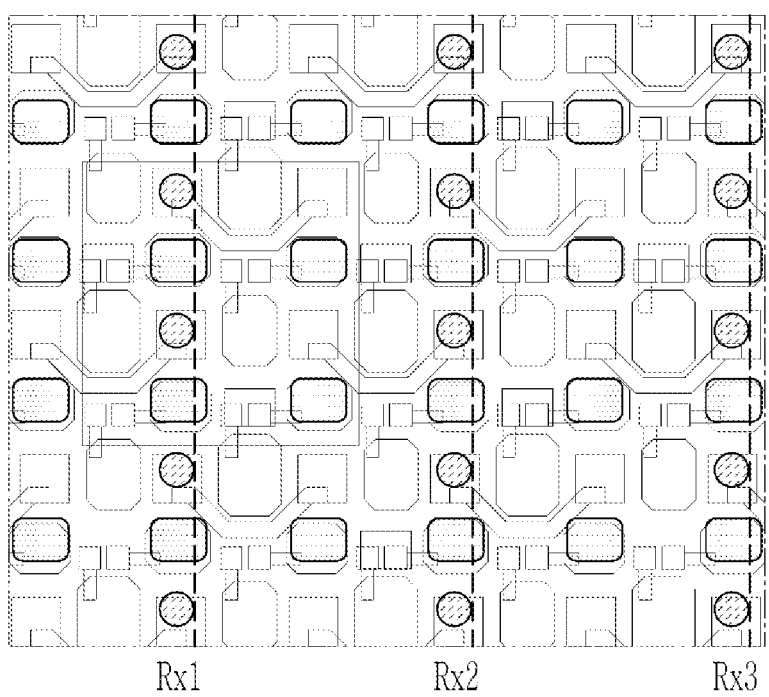
FIG. 5 corresponds to Embodiment 2 of FIG. 3.
Figure 6:
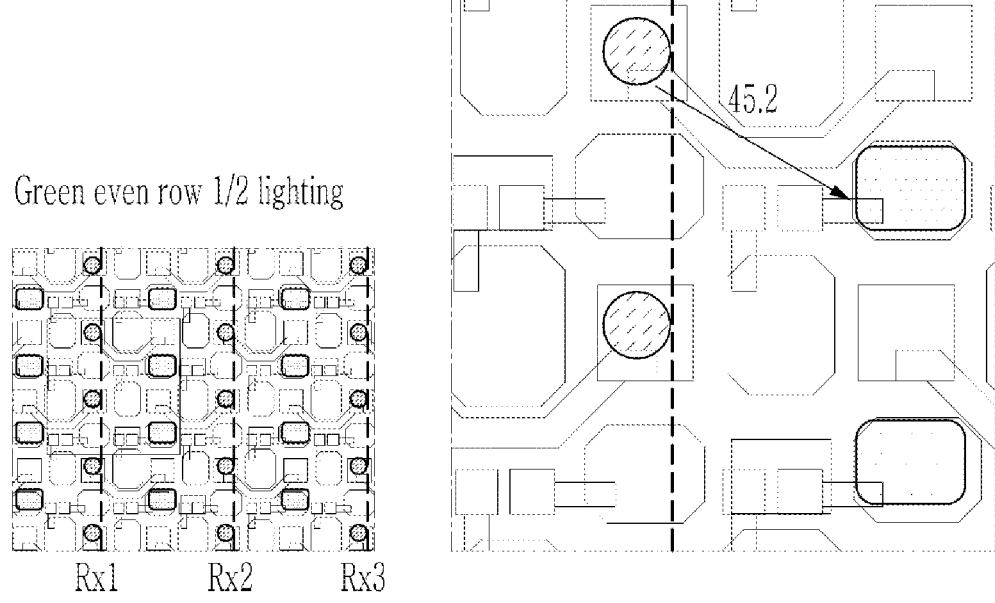
FIG. 6 corresponds to Embodiment 3 of FIG. 3.

Referring to FIG. 4, Embodiment 1 shows the shortest distance between the green pixel and the optical sensing device, and referring to FIG. 6, Embodiment 3 shows the longest distance between the green pixel and the optical sensing device. For example, the distance between the green pixel and the optical sensing device may be about 18.5 μm according to Embodiment 1, and the distance between the green pixel and the optical sensing pixel may be about 45.2 μm according to Embodiment 3.

Referring to FIG. 3, it is found that the performance of Embodiment 3 in which the distance between the green pixel and the optical sensing pixel is further distant than Embodiment 1 in which the distance between the green pixel and the optical sensing pixel is short. For example, it is found that the sensing performance is improved as the distance between the green pixel and the optical sensing pixel increases. This is because leakage of internal light is reduced and signal light is increased as the distance between the green pixel and the optical sensing pixel increases.

Hence, as shown in FIG. 1, regarding the display device according to the embodiment, the red pixel R and the blue pixel B are disposed to have different distance intervals in the first direction DR1, and the optical sensing pixel OS is disposed in the region with the wide gap H2 between the red pixel R and the blue pixel B. Hence, the distance between the optical sensing pixel OS and the green pixel G may be increased, and as shown in FIG. 3, the sensing performance of the optical sensing device may be increased.

Figure 7:
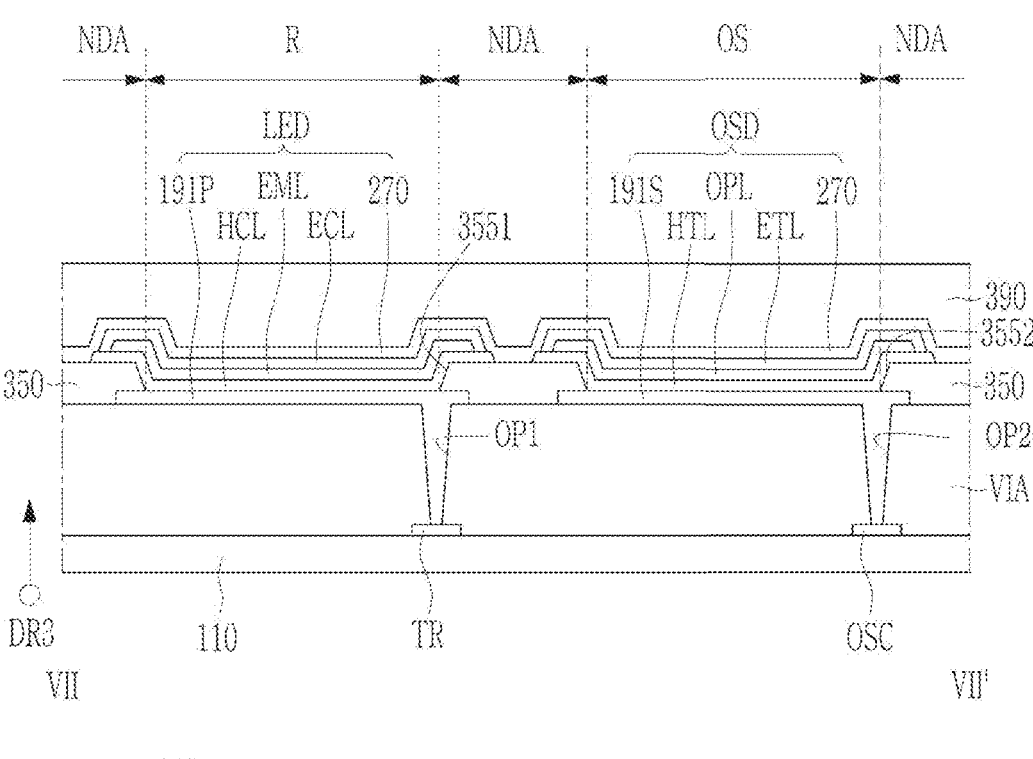
FIG. 7 shows a schematic cross-sectional view with respect to line VII-VII' of FIG. 1.

FIG. 7 shows a schematic cross-sectional view with respect to line VII-VII' of FIG. 1. FIG. 7 shows a schematic cross-sectional view of a display device according to the embodiment. Referring to FIG. 7, the display device may include a transistor TR and an optical sensing circuit OSC positioned on the substrate 110. FIG. 7 shows a red pixel R, an optical sensing pixel OS, and a non-light emitting area NDA.

The transistor TR may transmit a driving signal and a voltage for driving the light-emitting device LED. The optical sensing circuit OSC may sense light through photocharges generated by the optical sensing device OSD. The transistor TR and the optical sensing circuit OSC may include wires including a gate line and a data line, and a semiconductor. Detailed operations of the transistor TR and the optical sensing circuit OSC will be described in detail with reference to FIG. 14 to FIG. 16.

An insulating layer VIA may be positioned on the transistor TR and the optical sensing circuit OSC. The insulating layer may include an organic material. In detail, the insulating layer VIA may include an organic insulating material such as a general-purpose polymer such as poly(methyl methacrylate) (PMMA) or polystyrene (PS), a polymer derivative having a phenol-based group, an acryl-based polymer, an imide-based polymer, a polyimide, an acryl-based polymer, and a siloxane-based polymer.

A first electrode 191 may be positioned on the insulating layer VIA. The first electrode 191 may include a first light emitting electrode 191P of the light-emitting device LED and a first sense electrode 191S of the optical sensing device OSD. The insulating layer VIA may include a first opening OP1 and a second opening OP2. The first light emitting electrode 191P of the light-emitting device LED may be electrically connected to the transistor TR through the first opening OP1, and the first sense electrode 191S of the optical sensing device OSD may be electrically connected to the optical sensing circuit OSC through the second opening OP2. The first light emitting electrode 191P and the first sense electrode 191S may be formed according to a same process and may include a same material.

A cell barrier 350 may be positioned on the first light emitting electrode 191P and the first sense electrode 191S. The cell barrier 350 may include a first opening 3551 overlapping the first light emitting electrode 191P and a second opening 3552 overlapping the first sense electrode 191S.

A hole control layer HCL may be positioned in the first opening 3551 overlapping the first light emitting electrode 191P. An emission layer EML may be positioned on the hole control layer HCL, and an electron control layer ECL may be positioned on the emission layer. The hole control layer HCL may include a hole injection layer and a hole transport layer. In a like way, the electron control layer ECL may include an electron injection layer and an electron transport layer. The emission layer EML may emit blue, green, and red light at the respective pixels. The emission layer EML may have a structure in which emission layers for emitting different colors may be stacked each other.

A hole transport layer HTL may be positioned in the second opening 3552 overlapping the first sense electrode 191S. The hole transport layer HTL may be formed with a same material as the hole control layer HCL of the light-emitting device according to the same process thereof. A photoelectric conversion layer OPL is positioned on the hole transport layer HTL. The photoelectric conversion layer OPL may generate photo-charges that correspond to the light reflected from the ridge or valley between the ridges of the fingerprint and may transmit the photo-charges to the optical sensing circuit OSC. An electron transport layer ETL may be positioned on the photoelectric conversion layer OPL.

To be additionally described, the hole control layer HCL and the electron control layer ECL of the light emitting pixel PX may be formed according to the same process as the hole transport layer HTL and the electron transport layer ETL of the optical sensing pixel OS and may include a same material.

A second electrode 270 may be positioned on the electron transport layer ETL and the electron control layer ECL. The second electrode 270 may be generally positioned as a total plate on the optical sensing pixels (OS) and the light emitting pixels PX. Regarding the light emitting pixel PX, the first light emitting electrode 191P, the hole control layer HCL, the emission layer EML, the electron control layer ECL, and the second electrode 270 configure the light-emitting device LED. Regarding the optical sensing pixel OS, the first sense electrode 191S, the hole transport layer HTL, the photoelectric conversion layer OPL, the electron transport layer ETL, and the second electrode 270 configure the optical sensing device OSD. A capping layer 390 may be positioned on the second electrode 270.

Referring to FIG. 1, an implementation of the pixel array 10 according to the embodiment has a structure in which two green pixels G neighbor each other in the first direction DR1. Hence, the green emission layer may be deposited at one time by using one mask during the manufacturing process.

A manufacturing method according to the embodiment will now be described with the focus on formation of the light-emitting device LED and the optical sensing device OSD using a mask.

Figure 8:
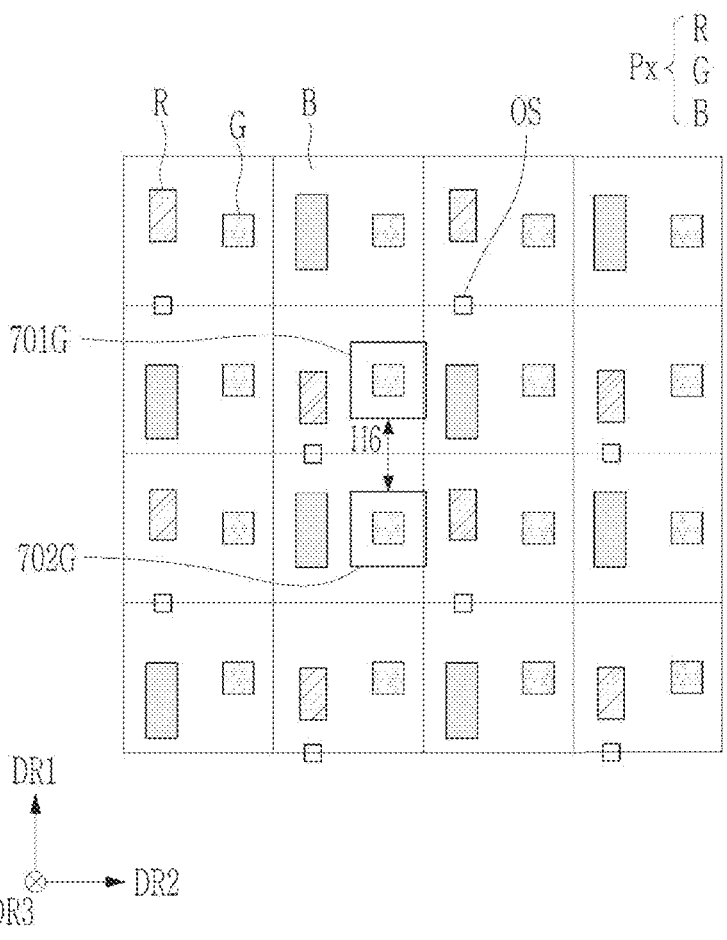
FIG. 8 shows a configuration of respectively depositing neighboring green pixels by using respective mask openings.

FIG. 8 shows a configuration of respectively depositing neighboring green pixels G by using respective mask openings 701G and 702G. FIG. 8 shows openings 701G and 702G of a mask, for example, regions deposited by the mask. Referring to FIG. 8, in case that the neighboring green pixels are deposited by using the mask having the openings 701G and 702G, the spaced distance H6 between the mask openings 701G and 702G must be obtained for the purpose of stable deposition. Therefore, the distance between the green pixels G must be equal to or greater than a minimum spaced distance between the mask openings 701G and 702G, and it works as a limit in the increase of resolution.

Figure 9:
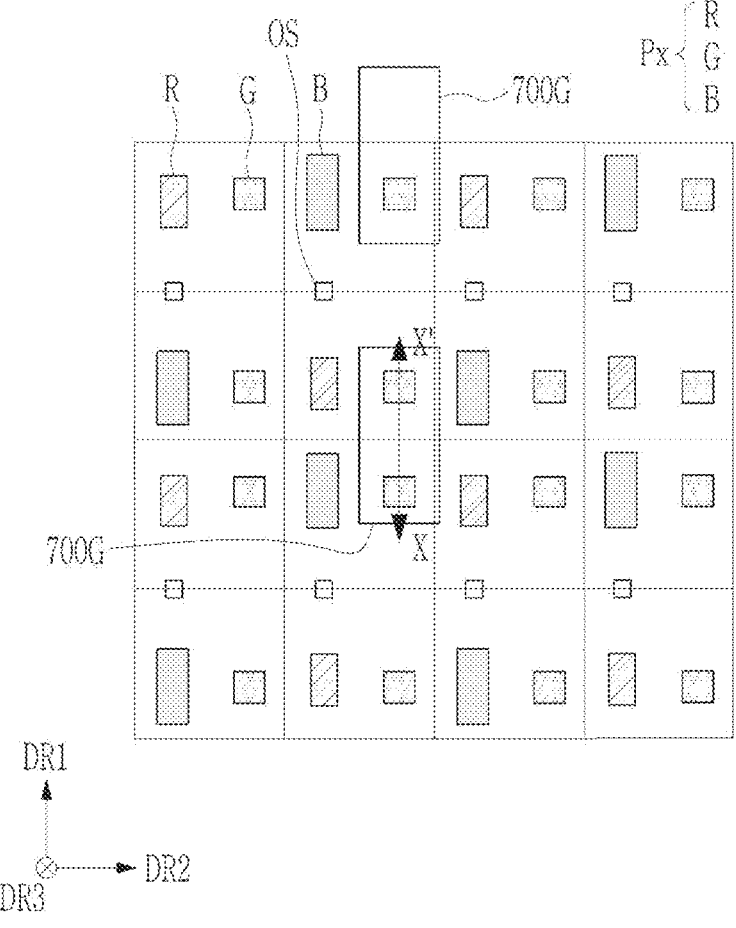
FIG. 9 shows a configuration of respectively depositing neighboring green pixels by using one mask opening according to an embodiment.

FIG. 9 shows a configuration of respectively depositing neighboring green pixels G by using one mask opening 700G according to an embodiment. FIG. 9 shows the opening 700G of the mask, for example, a region deposited by the mask. Referring to FIG. 9, two green pixels G neighbor each other so the green emission layer is deposited by using one mask opening 700G. FIG. 9 demonstrates that there is no need to consider the minimum separation space between the two neighboring green pixels G. Therefore, the pixels may be densely disposed and high resolution may be realized.

Figure 10:
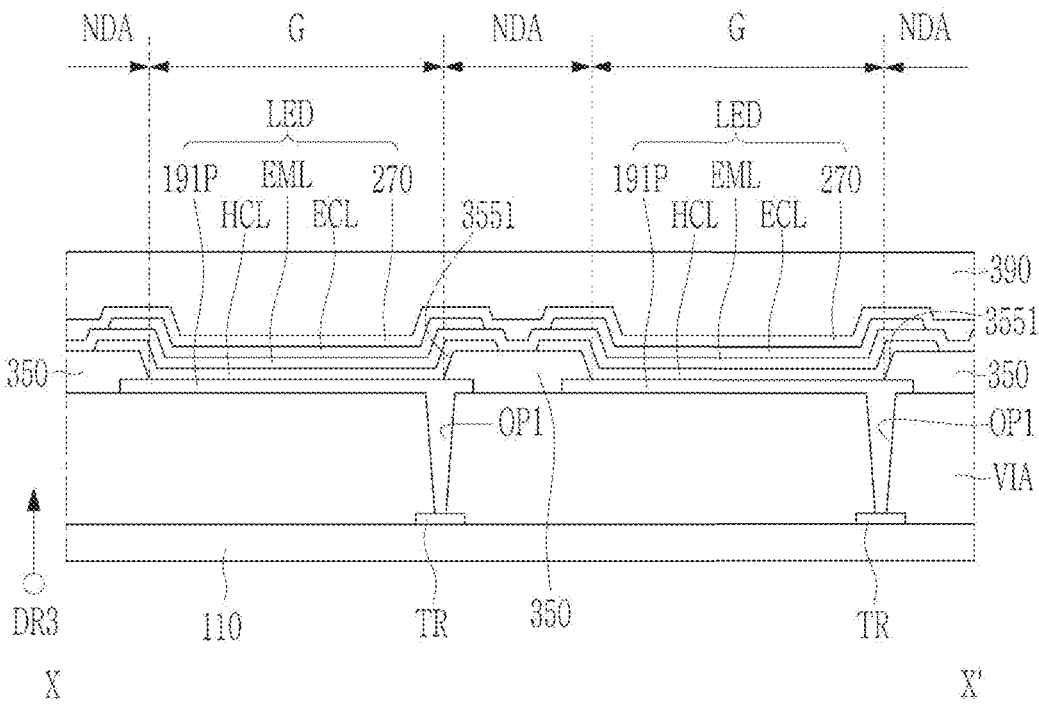
FIG. 10 shows a schematic cross-sectional view with respect to line X-X' of FIG. 9.

FIG. 10 shows a schematic cross-sectional view of a display device for depositing two neighboring green pixels G by using one mask opening in a like way given with FIG. 9. FIG. 10 shows a schematic cross-sectional view with respect to line X-X' of FIG. 9.

A stacking structure of FIG. 10 corresponds to the stacking structure described with reference to FIG. 7, except that the emission layers EML are electrically connected to one of the neighboring green pixels G so no same constituent elements will be described in detail.

Referring to FIG. 10, the emission layers EML may be electrically connected into one on the two neighboring green pixels G. This is because, as shown in FIG. 9, the emission layers EML of the two neighboring green pixels G are simultaneously formed with one mask opening 700G. In case that the emission layers EML are electrically connected as described above, there is no additional electrode positioned on a cell barrier 350 between the green pixels G so the green pixels G may be separated in the region of the first opening 3551 of the cell barrier 350 and may emit light.

FIG. 10 shows that the emission layers EML are formed with one mask opening 700G on the two neighboring green pixels G, and other layers that are not the emission layers EML may also be formed with one mask opening 700G. For example, the hole control layers HCL may be electrically connected to each other, or the electron control layers ECL may be electrically connected to each other on the two neighboring green pixels G.

The manufacturing method according to the embodiment may form a layer configuring the light emitting pixel PX and the optical sensing pixel OS by using one mask.

Figure 11:
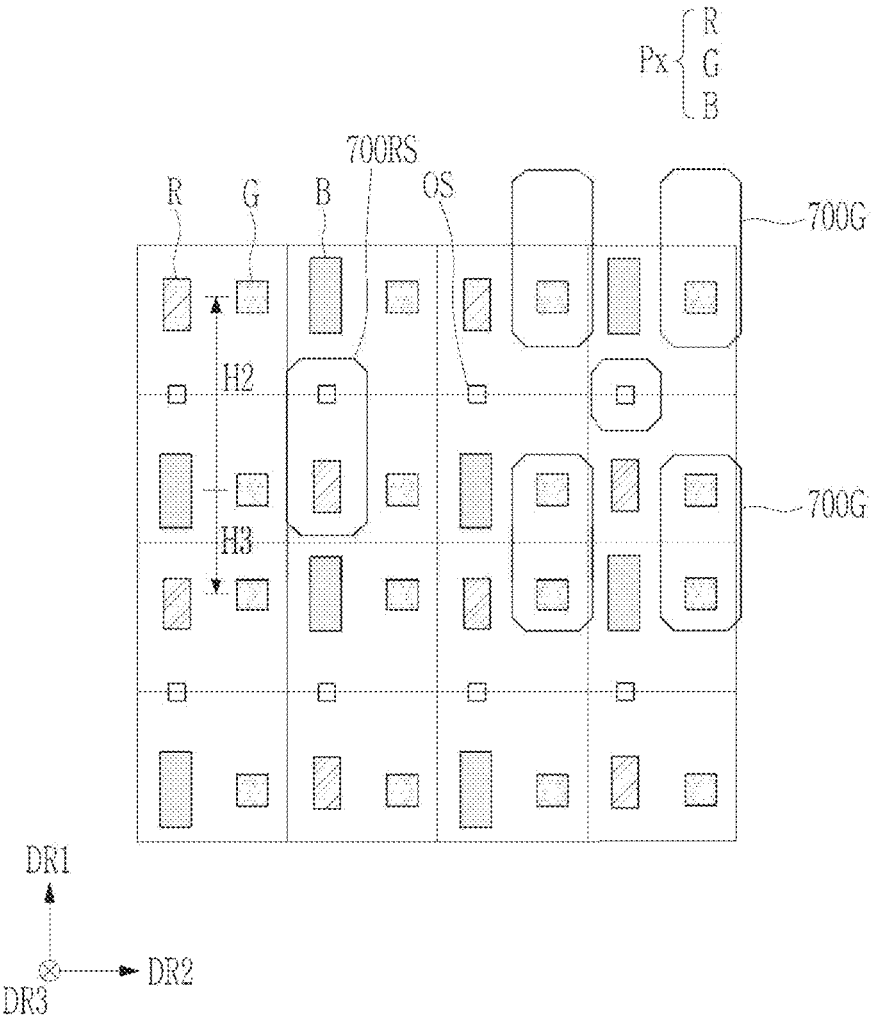
FIG. 11 shows a mask for forming a hole control layer of a red pixel and a hole transport layer of an optical sensing pixel.

As described above, the hole control layer HCL of the light emitting pixel PX and the hole transport layer of the optical sensing pixel may include the same material. FIG. 11 shows a mask for forming a hole control layer HCL of a red pixel R and a hole transport layer of an optical sensing pixel. Referring to FIG. 11, the mask according to the embodiment may include an opening 700RS overlapping the red pixel R and the optical sensing pixel OS. Hence, the hole control layer HCL of the red pixel R and the hole transport layer HTL of the optical sensing pixel OS may be simultaneously formed by using one mask. FIG. 11 shows the red pixel R and the optical sensing pixel OS as an example, and other light emitting pixels and the optical sensing pixel OS are applicable in the same way. The hole control layer HCL of the red pixel R and the hole transport layer HTL of the optical sensing pixel OS have been described as an example, and other layers configuring the respective light-emitting devices LED and the optical sensing device OSD are also applicable.

Depending on embodiments, the light-emitting devices LED and the optical sensing device OSD may further include an auxiliary layer, and the auxiliary layer may also be simultaneously formed by using one mask in which the opening of FIG. 11 is formed.

Figure 12:
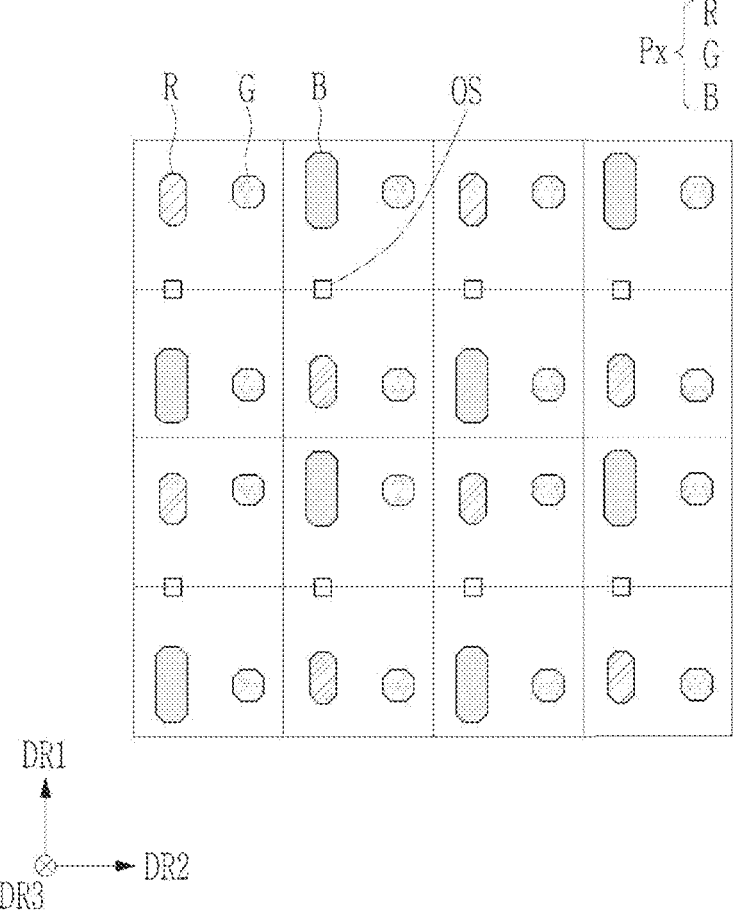
FIG. 12 shows an embodiment in which an opening of a light emitting pixel has an octagonal shape.

The respective pixel openings are shown to have a quadrangular shape, and the openings may have different shapes depending on embodiments. For example, the opening may have an octagonal shape. FIG. 12 shows a configuration in which an opening of a light emitting pixel PX has an octagonal shape. The structure shown in FIG. 12 may further increase the distance between the optical sensing pixel OS and the green pixel G than the case in which the opening has a quadrangular shape.

Figure 13:
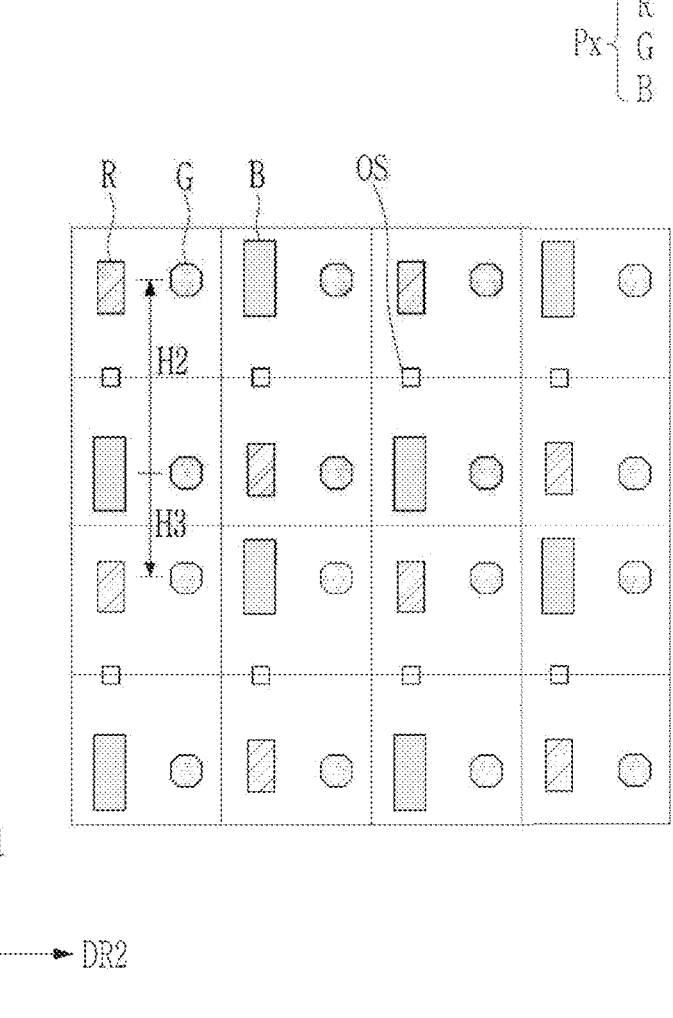
FIG. 13 shows a display device according to an embodiment.

FIG. 12 shows that the opening of the light emitting pixel PX has an octagonal shape, but depending on embodiments, the green pixel G may have an octagonal shape. FIG. 13 shows a display device according to an embodiment. Referring to FIG. 13, the display device according to the embodiment corresponds to an embodiment described with reference to FIG. 1 except that the green pixel G has an octagonal shape. No same constituent elements will be described in detail. In this case, the maximum opening of the display device may be obtained, and the maximum spaced distance between the optical sensing pixel OS and the green pixel G may be obtained. Therefore, the sensing performance of the optical sensing pixel OS may be increased without degrading the aperture ratio of the display device.

An operation of an optical sensing circuit OSC will now be described with reference to FIG. 14.

Figure 14:
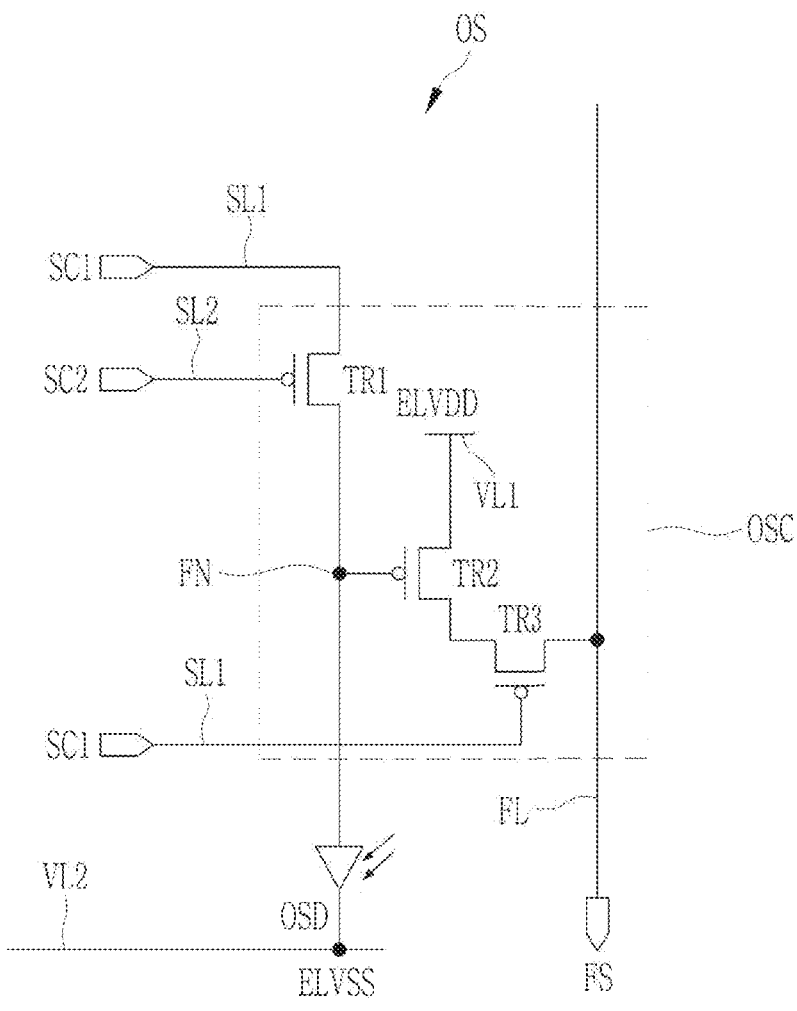
FIG. 14 shows a circuit of an optical sensing pixel.

FIG. 14 shows a circuit of an optical sensing pixel OS. Referring to FIG. 14, the optical sensing pixel OS may include an optical sensing device OSD and an optical sensing circuit OSC. The optical sensing circuit OSC may include a reset transistor TR1, an amplifying transistor TR2, and an output transistor TR3. The respective transistors may be p-type transistors such as PMOS, but are not limited thereto, and at least one of the reset transistor TR1, the amplifying transistor TR2, and/or the output transistor TR3 may be an n-type transistor.

The circuit configuration of the optical sensing pixel OSD according to the disclosure is not limited to what is described with reference to FIG. 14. The optical sensing circuit OSC shown in FIG. 14 is an example, and the configuration of the optical sensing circuit OSC may be modified.

Referring to FIG. 14, the optical sensing pixel OS of the display device according to an embodiment may include a reset transistor TR1, an amplifying transistor TR2, an output transistor TR3, and at least one optical sensing device OSD that are electrically connected to a fingerprint sensing line FL, a first scan line SL1, a second scan line SL2, a first voltage line VL1, and a second voltage line VL2. The embodiment will describe an example in which one optical sensing pixel OS may include one optical sensing device OSD.

A gate electrode of the reset transistor TR1 may be electrically connected to the second scan line SL2, a source electrode of the reset transistor TR1 may be electrically connected to the first scan line SL1, and a drain electrode of the reset transistor TR1 may be electrically connected to a charge stored node FN. The reset transistor TR1 may reset the charge stored node FN in response to a second scan signal SC2 transmitted by the second scan line SL2.

A gate electrode of the amplifying transistor TR2 may be electrically connected to the charge stored node FN, a source electrode of the amplifying transistor TR2 may be electrically connected to the first voltage line VL1, and a drain electrode of the amplifying transistor TR2 may be electrically connected to a source electrode of the output transistor TR3. The amplifying transistor TR2 is turned on by a voltage level of the charge stored node FN to transmit a first power voltage EVLDD received from the first voltage line VL1 to a source electrode of the output transistor TR3.

A gate electrode of the output transistor TR3 may be electrically connected to the first scan line SL1. A source electrode of the output transistor TR3 may be electrically connected to the drain electrode of the amplifying transistor TR2.

A drain electrode of the output transistor TR3 may be electrically connected to the fingerprint sensing line FL. The fingerprint sensing line FL may transmit a fingerprint sensing signal FS.

Figure 15:
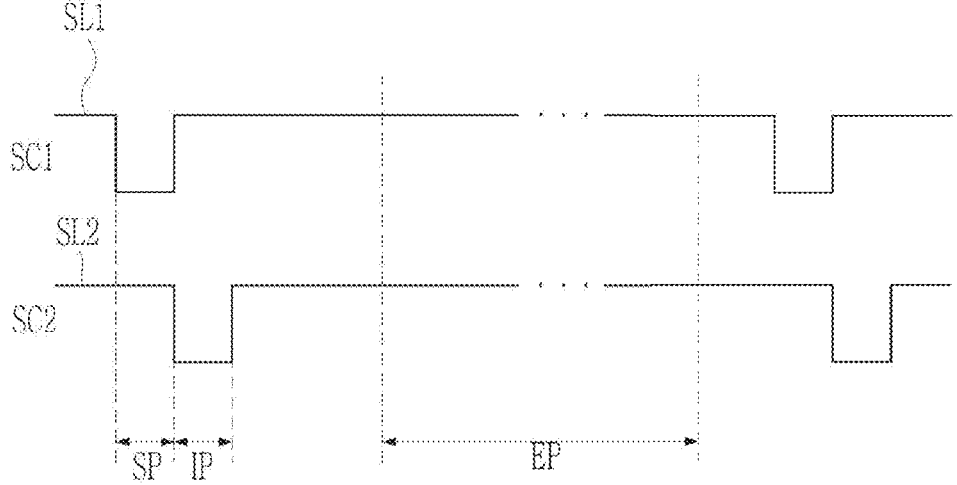
FIG. 15 shows a timing diagram of an operation of an optical sensing pixel shown in FIG. 14.

FIG. 15 shows a timing diagram of an operation of an optical sensing pixel OS shown in FIG. 14.

The optical sensing device OSD is exposed to external light for a light emitting section EP of the optical sensing pixel OS. The charges of the optical sensing device OSD may be used as main charge carriers.

In case that there is an input of a user, the optical sensing device OSD generates photo-charges that correspond to the light reflected by the ridges of the fingerprint or the valleys between the ridges, and the photo-charges may be stored in the charge stored node FN.

The amplifying transistor TR2 may be a source follower amplifier for generating a source-drain current in proportion to an amount of charges at the charge stored node FN input to the gate electrode.

For the sensing section SP, a low-level first scan signal SC1 is supplied through the first scan line SL1. In case that the output transistor TR3 is turned on corresponding to the low-level first scan signal SC1, the fingerprint sensing signal FS that corresponds to the current flowing through the amplifying transistor TR2 may be output to the fingerprint sensing line FL.

For the initialization section IP, in case that the low-level second scan signal SC2 is supplied through the second scan line SL2, the reset transistor TR1 is turned on. In this instance, as a high-level first scan signal SC1 is supplied to the source electrode of the reset transistor TR1, the high-level first scan signal SC1 is transmitted to the charge stored node FN to reset the charge stored node FN.

For the light emitting section EP, the optical sensing device OSD may generate the photo-charges that correspond to external light, and the generated photo-charges may be stored in the charge stored node FN.

Figure 16:
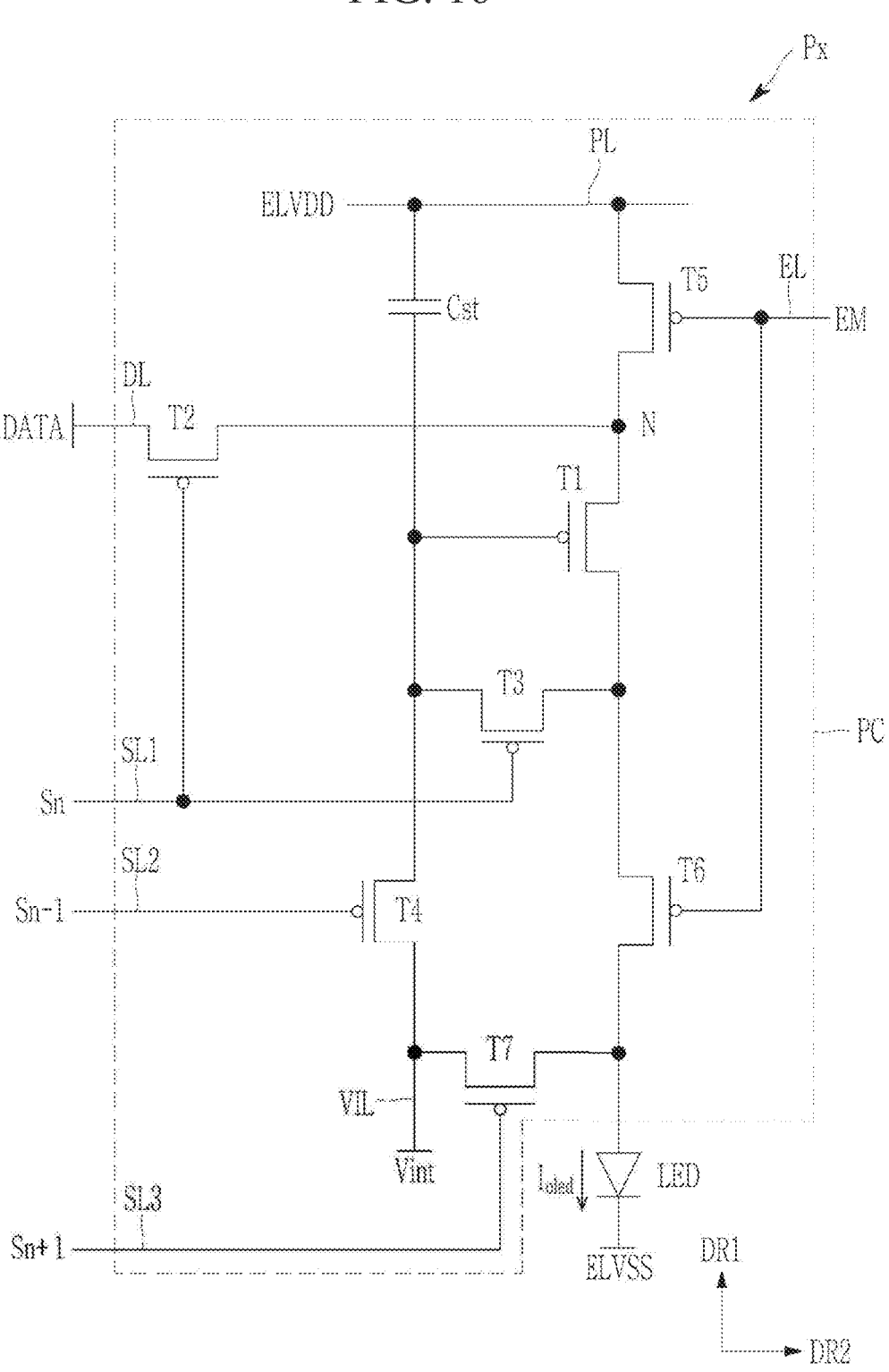
FIG. 16 shows an equivalent circuit diagram of a pixel according to an embodiment.

FIG. 16 shows an equivalent circuit diagram of a pixel PX according to an embodiment. The circuit diagram of FIG. 16 is an example and the disclosure is not limited thereto.

Referring to FIG. 16, the pixel circuit PC may include first to seventh transistors T1 to T7, and the first to seventh transistors T1 to T7 may be realized with thin film transistors. The pixel circuit PC may be electrically connected to the first scan line SL1 for transmitting a scan signal Sn, the second scan line SL2 for transmitting a previous scan signal Sn−1, a third scan line SL3 for transmitting a subsequent scan signal Sn+1, a light emitting control line EL for transmitting a light emitting control signal EM, and a data line DL for transmitting a data signal DATA. A power voltage line PL transmits the first power voltage ELVDD to the first transistor T1, and the initialization voltage line VIL transmits the initialization voltage VINT for initializing the first transistor T1 and the light-emitting device LED to the gate electrode of the first transistor T1 and the light-emitting device LED. The first scan line SL1, the second scan line SL2, the third scan line SL3, the light emitting control line EL, and the initialization voltage line VL may extend in a second direction DR2 and may be disposed to be spaced from each other in respective rows. The data line DL and the power voltage line PL may extend in the first direction DR1 and may be disposed to be spaced from each other in respective columns. The first transistor T1 may be electrically connected to the power voltage line PL through the fifth transistor T5, and may be electrically connected to the light-emitting device LED through the sixth transistor T6. The first transistor T1 is a driving transistor, and it receives the data signal DATA and supplies a driving current holed to the light-emitting device LED according to a switching operation of the second transistor T2. The second transistor T2 may be electrically connected to the first scan line SL1 and the data line DL, is turned on according to the scan signal Sn received through the first scan line SL1, and performs a switching operation for transmitting the data signal DATA transmitted to the data line DL to the node N. The third transistor T3 passes through the sixth transistor T6 and may be electrically connected to the light-emitting device LED. The third transistor T3 is turned on by a first scan signal GW received through the first scan line SL1 and diode-connects the first transistor T1. The fourth transistor T4 is turned on according to a previous scan signal Sn−1 received through the second scan line SL2 to transmit the initialization voltage VINT provided from the initialization voltage line VIL to the gate electrode of the first transistor T1 and initialize the gate voltage of the first transistor T1. The fifth transistor T5 and the sixth transistor T6 are turned on according to the light emitting control signal EM received through the light emitting control line EL and forms a current path so that the driving current holed may flow in the direction of the light-emitting device LED from the power voltage line PL, and the seventh transistor T7 is turned on according to the subsequent scan signal Sn+1 received from the third scan line SL3, and transmits the initialization voltage VINT provided by the initialization voltage line VIL to the light-emitting device LED to initialize the light-emitting device LED. The seventh transistor T7 may be omitted. The capacitor Cst may be electrically connected to the power voltage line PL and the gate electrode of the first transistor T1 to store and maintain a voltage that corresponds to a difference of voltage at respective ends and thereby maintain the voltage applied to the gate electrode of the first transistor T1. The light-emitting device LED may include a pixel electrode and an opposed electrode, and the opposed electrode may receive a second power voltage ELVSS. The light-emitting device LED receives the driving current holed from the first transistor T1 and emits light, thereby displaying images. Referring to FIG. 16, the seventh transistor T7 is shown to receive the subsequent scan signal Sn+1 through the third scan line SL3, and the seventh transistor T7 may be electrically connected to the second scan line SL2 and may receive the previous scan signal Sn−1.

Embodiments have been disclosed herein, and although terms are employed, they are used and are to be interpreted in a generic and descriptive sense only and not for purpose of limitation. In some instances, as would be apparent by one of ordinary skill in the art, features, characteristics, and/or elements described in connection with an embodiment may be used singly or in combination with features, characteristics, and/or elements described in connection with other embodiments unless otherwise specifically indicated. Accordingly, it will be understood by those of ordinary skill in the art that various changes in form and details may be made without departing from the spirit and scope of the disclosure as set forth in the following claims.

What is claimed is:

1. A display device comprising:
blue pixels, red pixels, green pixels, and optical sensing pixels disposed on a substrate, wherein:
a first group of the optical sensing pixels are disposed in a same line in a second direction,
a second group comprising a group of the red pixels, a group of the optical sensing pixels, and a group of the blue pixels are disposed in a same line in a first direction that is perpendicular to the second direction, and
a distance between a first of the blue pixels and a first of the red pixels disposed with a first of the optical sensing pixels therebetween is longer than a distance between the first of the blue pixels and a second of the red pixels without the optical sensing pixel therebetween.

2. The display device of claim 1, wherein
the first of the red pixels, the first of the optical sensing pixels, the first of the blue pixels, the second of the red pixels, a second of the optical sensing pixels, and a second of the blue pixels are disposed in a sequential order in the first direction.

3. The display device of claim 1, wherein
a group of the green pixels are disposed in a same line in the first direction.

4. The display device of claim 3, wherein
the group of the green pixels are not disposed in a same line in the first direction in which the second group is disposed.

5. The display device of claim 3, wherein
emission layers of green pixels neighboring in the first direction are electrically connected to each other.

6. The display device of claim 3, wherein the green pixels are disposed in parallel to each other in the first direction, and a distance between a first of the green pixels in the group and a neighboring second of the green pixels in the group in the first direction is different from a distance between the first of the green pixels and a neighboring third of the green pixels in the group in a direction opposite to the first direction.

7. The display device of claim 1, wherein
the first group of the optical sensing pixels are not disposed in a same line in the second direction in which any red pixel, any green pixel, and any blue pixel are disposed.

8. The display device of claim 1, wherein
the blue pixels, the green pixels, the red pixels, and the optical sensing pixels each have a corresponding opening of a quadrangular shape.

9. The display device of claim 1, wherein
at least one of the blue pixels, green pixels, or red pixels has an opening of an octagonal shape.

10. A display device comprising:
pixel sections disposed on a substrate, wherein:
at least one of the pixel sections includes four green pixels, two red pixels, two blue pixels, and two optical sensing pixels,
a group of the optical sensing pixels are disposed in a same line in a first direction in which a corresponding group of the red pixels and a corresponding group of the blue pixels are disposed, each optical sensing pixel is not disposed, in a same line in a second direction that is perpendicular to the first direction, with any of the red pixels, any of the green pixels, or any of the blue pixels, and a distance of two of the green pixels disposed in one of the pixel sections in the first direction is greater than a distance of two neighboring green pixels disposed in respective neighboring pixel sections in the first direction.

11. The display device of claim 10, wherein none of the green pixels are disposed, in a same line in the first direction, in which any of the red pixels, any of the blue pixels, and any of the optical sensing pixels are disposed.

12. The display device of claim 10, wherein in the one of the pixel sections, two corresponding ones of the green pixels are disposed in a same line in the second direction in which a corresponding one of the red pixels and a corresponding one of the blue pixels are disposed.

13. The display device of claim 10, wherein emission layers of two green pixels disposed in other units and neighboring in the first direction are electrically connected to each other.

14. The display device of claim 10, wherein the blue pixels, the green pixels, the red pixels, and the optical sensing pixels each have a corresponding opening of a quadrangular shape.

15. The display device of claim 10, wherein at least one of the blue pixels, the green pixels, or the red pixels has an opening of an octagonal shape.

\* \* \* \* \*